(12) United States Patent
Lofland et al.

(10) Patent No.: US 6,577,504 B1
(45) Date of Patent: Jun. 10, 2003

(54) INTEGRATED HEAT SINK FOR DIFFERENT SIZE COMPONENTS WITH EMI SUPPRESSION FEATURES

(75) Inventors: Steve Lofland, Portland, OR (US); Scott Noble, Beaverton, OR (US); Murli Tirumala, Beaverton, OR (US); Lloyd L. Pollard, II, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 09/650,571

(22) Filed: Aug. 30, 2000

(51) Int. Cl.⁷ .................................................. H05K 7/20
(52) U.S. Cl. ..................... 361/709; 361/704; 361/703; 361/818; 257/706; 257/712; 257/713; 257/722; 174/16.1; 174/16.3; 165/80.3; 165/185
(58) Field of Search ................................ 361/688, 690, 361/695, 704, 818, 718, 719; 257/706, 713, 717, 704, 719; 174/16.1, 16.3; 165/80.2, 80.3, 104.33, 185

(56) References Cited

U.S. PATENT DOCUMENTS

| | | | |
|---|---|---|---|
| 5,052,481 A | * 10/1991 | Horvath et al. ............. 165/185 |
| 5,175,613 A | * 12/1992 | Barker, III et al. .......... 257/713 |
| 5,184,211 A | * 2/1993 | Fox .............................. 257/706 |
| 5,396,403 A | * 3/1995 | Patel ........................... 361/705 |
| 5,587,882 A | * 12/1996 | Patel ........................... 361/705 |
| 5,880,930 A | * 3/1999 | Wheaton ...................... 361/690 |
| 5,931,222 A | * 8/1999 | Toy et al. .................... 165/80.3 |
| 5,956,576 A | * 9/1999 | Toy et al. .................... 438/125 |
| 5,995,367 A | * 11/1999 | Smith et al. ................. 361/695 |

* cited by examiner

Primary Examiner—Boris Chervinsky
(74) Attorney, Agent, or Firm—Schwegman, Lundberg, Woessner & Kluth, P.A.

(57) ABSTRACT

An integrated heat sink that can provide heat dissipation from multiple components mounted on a circuit board with each component having a different height dimension relative to each other is described. The heat sink has a first face on which a plurality of cooling fins are formed and a second face on which at least one pedestal is formed. The pedestal has a contacting surface to thermally couple to at least one of the multiple components to dissipate heat therefrom. The heat sink is designed to prevent a junction temperature at the contact area where the heat sink and each of the components abut one another from exceeding a maximum design value for the system. In one embodiment of the present invention, the heat sink has a groove formed in the second face. A conductive gasket is disposed in the groove and contacts a metal trace on the circuit board when the heat sink is attached to the circuit board to form a Faraday cage or EMI shield.

20 Claims, 4 Drawing Sheets

INTEGRATED HEAT SINK FOR DIFFERENT SIZE COMPONENTS WITH EMI SUPPRESSION FEATURES

FIELD OF THE INVENTION

The present invention relates generally to computer board and chip packaging, and more particularly to an integrated heat sink for use with components having different heights and in one embodiment electromagnetic interference (EMI) suppression features.

BACKGROUND INFORMATION

Ever increasing performance demands are being placed on computer circuits and other integrated circuits (ICs). ICs are being required to operate at continually increasing clock speeds. Component density demands are also increasing as electronic devices become more compact and are required to perform more functions in a shorter period of time. The increased densities and higher operating speeds also result in higher power consumption and the generation of heat within the components. The heat generated needs to be dissipated to maintain proper operating tolerances of the components and to preserve the longevity of the individual components. Heat sinks have been traditionally used for this purpose.

Typical heat sink designs have focused on single heat sources or single IC components. Accordingly, the features of a heat sink are designed to satisfy the thermal requirements of a specific single component and the heat sink has a structure to only contact that single component for the dissipation of heat. With increased performance requirements, the size of heat sinks are expected to increase to effectively dissipate the higher heat generated to maintain operating tolerances. Furthermore, with component densities increasing and the thermal design requirements of other core components in systems, such as computers and the like, going up, the size and number of heat sinks will need to increase. In contrast, consumers want products that are smaller, lighter in weight and more portable.

The tighter densities and higher clock speeds are also expected to present electromagnetic interference (EMI) problems where the operation of adjacent circuits can be adversely affected by spurious electromagnetic energy or signals transmitted from other proximally located circuits clocked at higher frequencies.

Accordingly, for the reason stated above, and for other reasons that will become apparent to those skilled in the art upon reading and understanding the present specification, there is a need for an integrated, single heat sink that can provide heat dissipation from multiple components of varying heights and other dimensions and with varying thermal design requirements that is efficient and compact and that also provides suppression of electromagnetic interference for proper operation of circuits that would be adversely affected by electromagnetic interference generated by other proximally located circuits clocked at higher frequencies.

DESCRIPTION OF THE PREFERRED EMBODIMENTS

In the following detailed description of the preferred embodiments, reference is made to the accompanying drawings which form a part hereof, and in which is shown by way of illustration specific embodiments in which the invention may be practiced. It is to be understood that other embodiments may be utilized and structural changes may be made without departing from the scope of the present invention.

Figure 1:
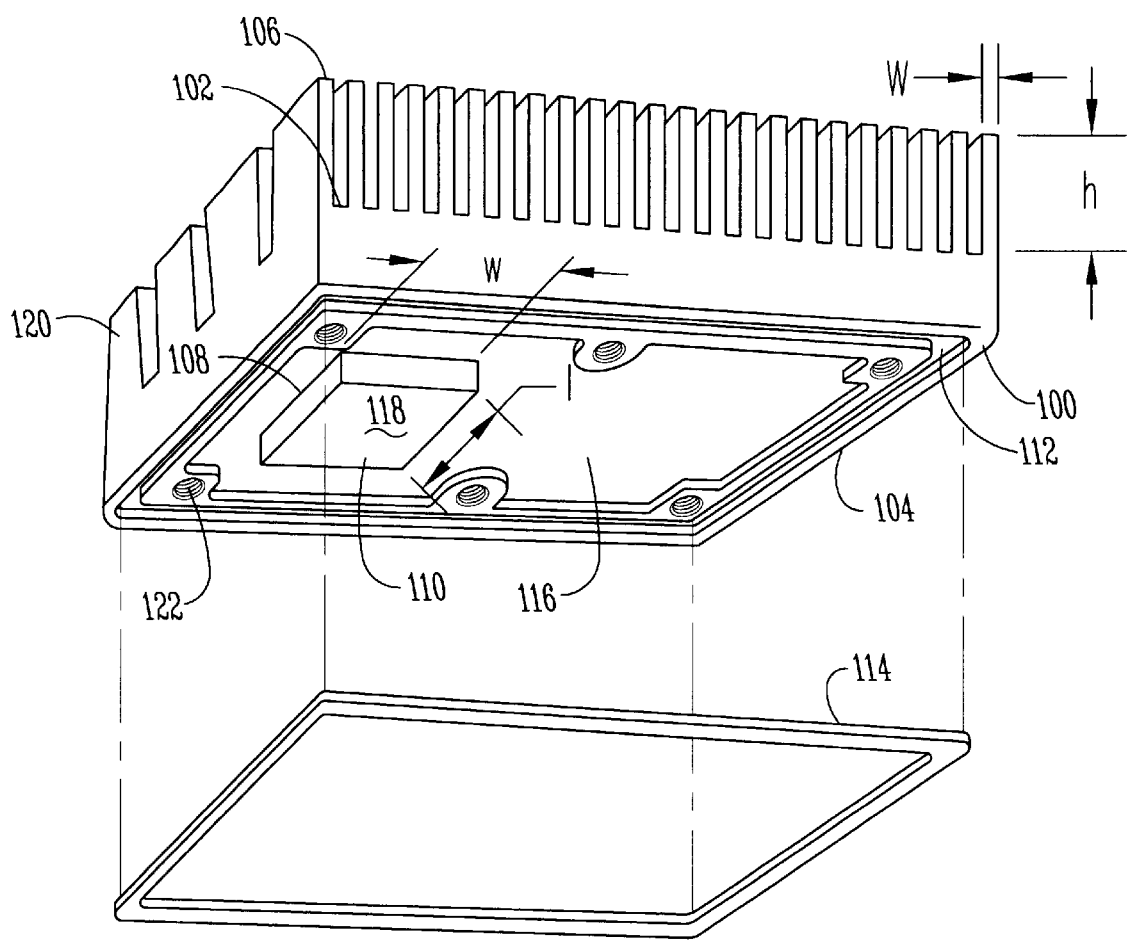
FIG. 1 is an exploded isometric view of a heat sink in accordance with one embodiment of the present invention.

FIG. 1 shows an exploded isometric view of a heat sink 100 in accordance with one embodiment of the present invention. The heat sink 100 includes a first face 102 and a second face 104 substantially opposite to the first face 102. The first face 102 has a plurality of cooling fins 106 formed thereon. The cooling fins 106 preferably have a high aspect ratio, i.e., the cooling fins 106 are substantially longer in the height (h) dimension compared to the width (w) dimension, to provide maximum dissipation of heat into the surrounding air. The aspect ratio of the cooling fins 106 may typically be in the range of about 14:1 or greater for a microprocessor. It should be noted that other design constraints may require that the cooling fins have a lower aspect ratio geometry.

Figure 2:
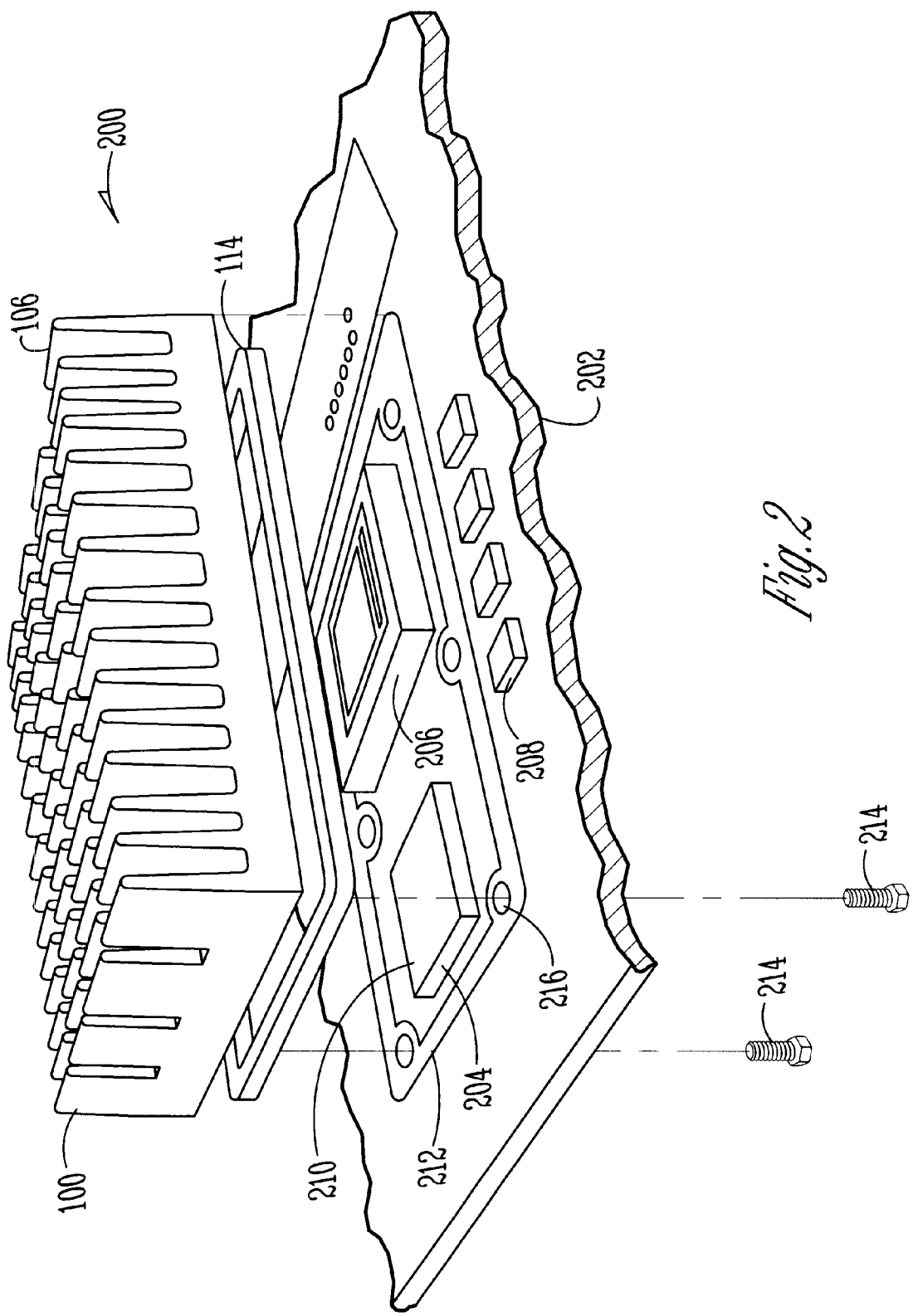
FIG. 2 is an exploded isometric view of a heat sink for assembly with a circuit board in accordance with one embodiment of the present invention.

Referring also to FIG. 2, an exploded isometric view of an unassembled device or system 200 that uses the heat sink 100 of FIG. 1 is shown. The system 200 includes a circuit board 202 with components 204, 206 and 208 mounted thereon. In the example shown in FIG. 2, the components 204, 206 and 208 may be a chipset 204, a central processing unit (CPU) 206 and other components or circuits 208 that operate together in the computing system 200.

In accordance with one embodiment of the present invention, as shown in FIG. 1, at least one plateau or pedestal 108 is formed in the second face 104 of the heat sink 100 to thermally couple the heat sink 100 to at least one component, the chipset 204 in the example shown in FIG. 2, that has a different (shorter) height dimension relative to other components, such as CPU 206, also mounted on the circuit board 202. The linear dimensions of a contacting surface 110 on the top of the pedestal 108 may also correspond substantially to the linear dimensions of a contacting surface 210 on the top of the chipset 204 to maximize the area of contact between the heat sink 100 and the chipset 204 for maximum heat transfer from the chipset 204 to the heat sink 100. The contacting surface 110 of the pedestal 108 is shown to be substantially flat in FIG. 1 so as to matingly contact with the facing surface 210 of the chipset 204 when the heat sink 100 is assembled with the circuit board 202. The contacting surface 110 of the pedestal 108 could also be formed with any features required to correspond to the features of any component to which the pedestal 108 was to contact. Accordingly, the contact area between the pedestal 108 and the component or chipset 204 would be maximized for the greatest transfer of heat from the chipset 204 to the heat sink 100.

In one embodiment of the present invention, the contacting surface 110 of the pedestal 108 has a selected length (l) and width (w) so that the contacting surface 110 provides a predetermined thermal contact area 118 between the heat sink 100 and the chipset 204 for the dissipation of heat from the chipset 204. The predetermined contact area 118 is sized to prevent a junction temperature at the contacting surfaces 110 and 210 of the pedestal 108 and chipset 204 from exceeding a maximum design value.

While the present invention has been described with respect to forming a pedestal 108 on the second face 104 of the heat sink 100, those skilled in the art will recognize that alternatively the second face 104 could be formed with a thickness the same height as the pedestal 108 and a recess could be formed in the second face 104 of the heat sink 100 to accommodate taller components such as CPU 206 mounted on the circuit board 202. FIG. 1 essentially shows that the pedestal 108 gives the appearance that other areas of the second face 104 of the heat sink 100 are recessed for accommodating taller components 206.

The heat sink 100 may be made from any heat conductive material such as an aluminum or copper alloy or the like that will facilitate the transfer of heat from the components 204 and 206 to the heat sink 100 according to design requirements.

Figure 3:
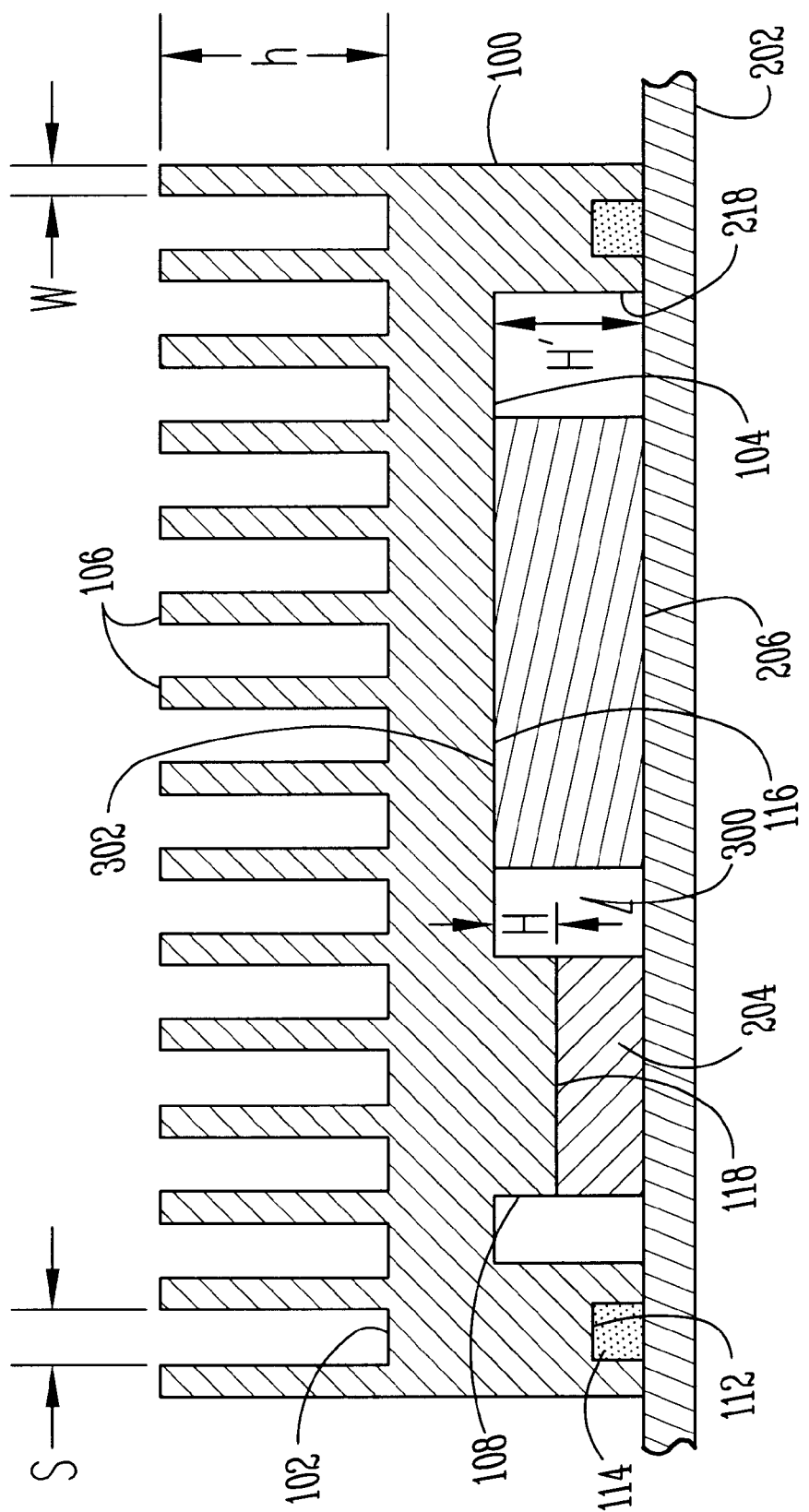
FIG. 3 is a cross-sectional view of a heat sink and circuit board assembly according to one embodiment of the present invention.

In accordance with one embodiment of the present invention, a channel or groove 112 may also be formed around a perimeter of the second face 104 of the heat sink 100. A gasket 114 is disposed within the groove 112. The gasket 114 is made from an electromagnetic material, such as a metallized rubber or a plastic with an electromagnetic material of a predetermined pitch or concentration contained therein so that the gasket 114 has the appropriate electrical conductive properties. A conductive line or trace 212 is formed on the circuit board 202 and has dimensions and shape corresponding substantially to the groove 112 and the gasket 114. At least a small portion of the gasket 114 extends beyond the groove 112 prior to assembly. The gasket 114 may then compress slightly to completely contact the conductive trace 212 on the circuit board 202 all around the perimeter of the heat sink 100 to ground the heat sink 100 to the circuit board 202 and to make a tight EMI shielding seal between the heat sink 100 and the circuit board 202 when the heat sink 100 is attached to the circuit board 202 in a functional position with pedestal 108 contacting the chipset 204 and the interior thermal contact surface 116 of the heat sink 100 in contact with the CPU 206. A Faraday cage for EMI shielding is created by the sealing action of the gasket 114 in contact with the conductive trace 212 on the circuit board 202. As best shown in FIG. 3, the Faraday cage enclosure 300 formed by the heat sink 100 in grounded contact with the circuit board 202 via the sealing gasket 114 will substantially suppress any electromagnetic interfering energy or signals generated by the chipset 204 and the CPU 206 from being transmitted outside of the enclosure 300 where the electromagnetic interference could adversely affect the operation of other circuits or components 208 clocked at different frequencies and located within a proximate distance to the chipset 204 and the CPU 206 to potentially be adversely affected by the EMI.

Referring to FIG. 3, the heat sink 100 needs to be manufactured to relatively close tolerances so that when the heat sink 100 is attached to the circuit board 202 and the gasket 112 forms a seal around the perimeter of the second face 104 of the heat sink 100 for EMI shielding, the pedestal 108 must be of close height (H) tolerance to enable use of interface materials to thermally contact the chipset 204. Similarly, the interior wall 218 of the heat sink 100 should also be of a close height (H') tolerance to enable the use of thermal interface materials where the heat sink thermal contact area 116 (FIG. 1) contacts the top 302 of the CPU 206. The gasket 114 can also compensate for some lack of tolerance.

While the groove 112 and gasket 114 are shown to extent substantially around the perimeter of the second face 104 of the heat sink 100 forming a substantially rectangular shape, the groove 112 and gasket 114 could be formed in any shape in relation to any particular component layout on the circuit board 202 to isolate selected components 204 and 206 to suppress electromagnetic interference.

In a another embodiment of the present invention where EMI suppression is not as critical, the heat sink 100 may be formed without the groove 112 and the gasket 114. The heat sink 100 will then be connected directly to the circuit board 202. The conductive trace 212 may be provided to ground the heat sink 100 to the circuit board 202.

Referring to FIG. 3, depending upon the thermal design constraints of the system 200 and its components 204 and 206 with which the heat sink 100 will be used, the cooling fins 106 may be designed to have a predetermined aspect ratio, fin spacing (S) and exposed surface area 120 to dissipate an expected quantity of heat according to the cooling fin design parameters. The cooling fins 106 may therefore be designed to maintain a junction temperature along the thermal contact area 118 between the heat sink 100 and chipset 204 and along a thermal contact area 116 between the heat sink 100 and the CPU 206 at or below a predetermined maximum design value.

The heat sink 100 may be attached to the circuit board 202 by fasteners 214 (FIG. 2), such as a bolts, screws or the like. The fasteners 214 would extend through holes 216 formed in the circuit board 202 and attach to correspondingly drilled and tapped holes 122 (FIG. 1) in the heat sink 100 that are in proper registration with holes 216 in the circuit board 202 to provide proper alignment of the heat sink 100 on the circuit board 202 when assembled.

Figure 4:
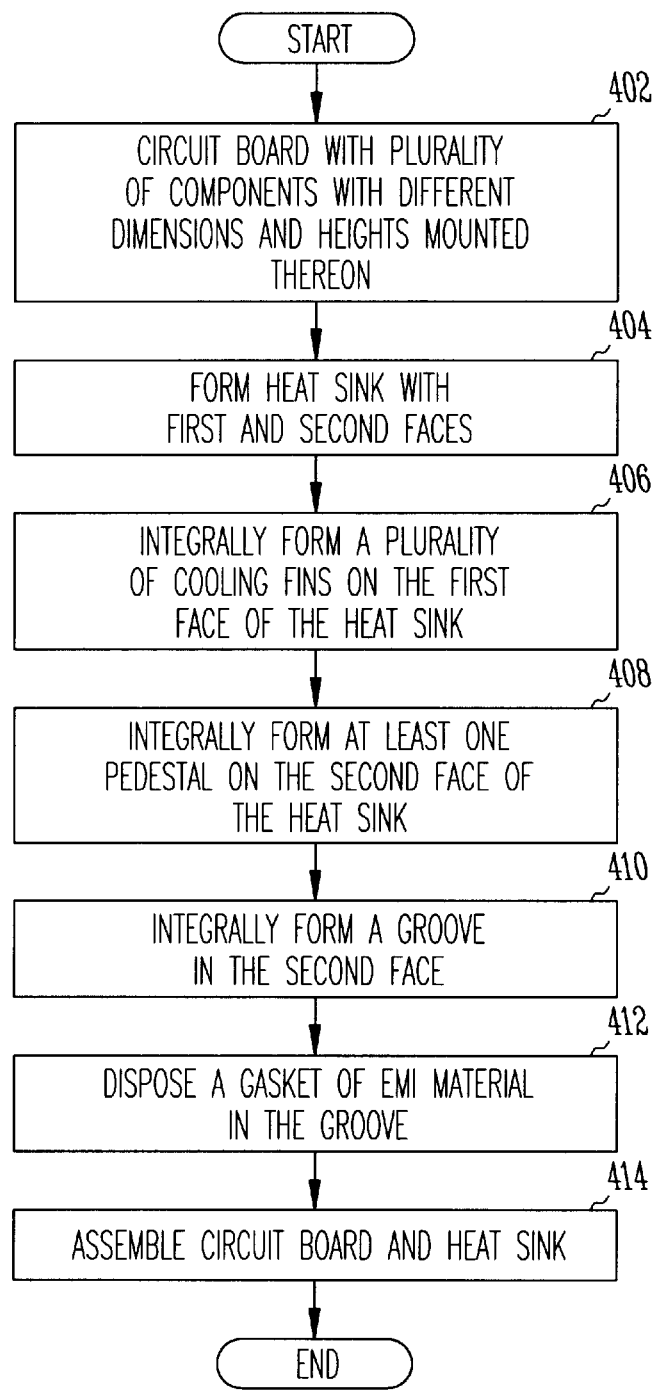
FIG. 4 is a flow chart of a method for forming a heat sink and assembling the heat sink and a circuit board in accordance with one embodiment of the present invention.

FIG. 4 is a flow chart 400 illustrating one example of a method of making the heat sink 100 and assembling the heat sink 100 and the circuit board 202 in accordance with one embodiment of the present invention. The circuit board 202 is provided in action box 402 with a plurality of components 204, 206 and 208 mounted thereon. The components 204, 206 and 208 have different heights. In action box 404 the heat sink 100 is formed with the first face 102 and the second face 104. The plurality of cooling fins 106 is formed on the first face 102 in action box 406 and the at least one pedestal 108 is formed on the second face 104 in action box 408. In action box 410 the groove 112 is integrally formed in the second face 104 and the gasket 114 of EMI material is disposed in the groove 114 in action box 412. The heat sink 100 and circuit board 202 are then assembled and fastened together in action box 414. The actions in FIG. 4 are not intended to be in any specific order. For example, the cooling fins 106, pedestal 108 and groove 112 could be formed in any order.

The features of the heat sink 100 described above are applicable to both passive heat sinks and active heat sinks, where passive heat sinks are those without an integral cooling fan and active heat sinks are those with an integral cooling fan.

CONCLUSION

An integrated heat sink that can provide heat dissipation from multiple components mounted on a circuit board with each component having a different height dimension relative to each other has been described. The heat sink has a first face on which a plurality of cooling fins are formed and a second face on which at least one pedestal is formed. The pedestal has a contacting surface to thermally couple to at least one of the multiple components to dissipate heat therefrom. The heat sink is designed to prevent a junction temperature at the contact area where the heat sink and each of the components abut one another from exceeding a maximum design value for the system. In one embodiment of the present invention, the heat sink has a groove formed in the second face. A conductive gasket is disposed in the groove and contacts a metal trace on the circuit board when the heat sink is attached in a functional position to the circuit board to form a Faraday cage or EMI shield. The heat sink of the present invention is efficient in that it provides heat dissipation for multiple components and eliminates the need for each component having its own heat sink. The heat sink also serves as an EMI shield for those components covered by the heat sink when it is attached to a circuit board.

Although specific embodiments have been illustrated and described herein, it will be appreciated by those of ordinary skill in the art that any arrangement which is calculated to achieve the same purpose may be substituted for the specific embodiment shown. This application is intended to cover any adaptations or variations of the present invention. Therefore, it is intended that this invention be limited only by the claims and the equivalents thereof.

What is claimed is:

1. A heat sink, comprising:
   a first face;
   a second face disposed substantially opposite to the first face;
   a plurality of cooling fins formed on the first face;
   at least one pedestal formed on the second face to thermally couple to at least one component with a different height dimension relative to other components on a circuit board;
   a groove with continuous sidewalls integrally formed in the second face; and
   a gasket of electromagnetic interference (EMI) material disposed in the groove to form a Faraday cage around selected components on the circuit board with the heat sink being placed in a functional position on the circuit board, wherein the gasket is substantially completely covered by the sidewalls of the groove when the heat sink is placed in the functional position.

2. The heat sink of claim 1, wherein the heat sink is grounded to the circuit board by the EMI gasket.

3. The heat sink of claim 1, wherein the at least one pedestal has dimensions to provide a predetermined contact area between the heat sink and the at least one component to prevent a junction temperature from exceeding a maximum design value.

4. The heat sink of claim 1, wherein each of the plurality of cooling fins have an aspect ratio greater than about 14:1.

5. The heat sink of claim 1, wherein each of the cooling fins have a predetermined aspect ratio to maintain a junction temperature along a thermal contact area between the heat sink and the at least one component at or below a predetermined maximum design value.

6. The heat sink of claim 1, wherein the heat sink is an active heat sink.

7. The heat sink of claim 1, wherein the heat sink is a passive heat sink.

8. An electronic system, comprising:
   a circuit board;
   a central processing unit (CPU) mounted on the circuit board;
   at least one chipset mounted on the circuit board and electrically connected to the CPU for operation in conjunction with the CPU;
   a heat sink comprising a first face and a second face disposed substantially opposite to the first face;
   a plurality of cooling fins integrally formed on the first face;
   at least one pedestal integrally formed on the second face, the at least one pedestal having a predetermined height to thermally contact at least one of the CPU and the chipset with the heat sink being assembled on the circuit board in thermal contact with the CPU and the chipset;
   a groove with continuous sidewalls integrally formed in the second face; and
   a gasket of electromagnetic interference (EMI) material disposed in the groove to form a Faraday cage around selected components on the circuit board with the heat sink being placed in a functional position on the circuit board, wherein the gasket is substantially completely covered by the sidewalls of the groove when the heat sink is placed in the functional position.

9. The electronic system of claim 8, wherein the at least one pedestal has dimensions to provide a predetermined contact area between the heat sink and at least one of the CPU and chipset to prevent a junction temperature from exceeding a maximum design value.

10. The electronic system of claim 8, wherein the heat sink is grounded to the circuit board by the gasket.

11. The electronic system of claim 8, wherein each of the cooling fins have a predetermined aspect ratio to prevent a junction temperature along a thermal contact area between the heat sink and the CPU and the heat sink and the chipset from exceeding respective predetermined maximum design values.

12. An electronic system, comprising:
    a circuit board;
    a central processing unit (CPU) mounted on the circuit board;
    at least one chipset mounted on the circuit board and electrically connected to the CPU for operation in conjunction with the CPU;
    a heat sink comprising a first face and a second face disposed substantially opposite to the first face;
    a plurality of cooling fins integrally formed on the first face;
    selected features integrally formed in the second face to provide predetermined contact areas between the heat sink and the CPU and the heat sink and the chipset to prevent a junction temperatures at the contact areas from exceeding design limits;
    a groove with continuous sidewalls integrally formed in the second face; and
    a gasket of electromagnetic interference (EMI) material disposed in the groove to form a Faraday cage around selected components on the circuit board with the heat sink being placed in a functional position on the circuit board, wherein the gasket is substantially completely covered by the groove when the heat sink is placed in the functional position.

13. A method comprising:
    providing a circuit board with a plurality of components with different dimensions and heights mounted thereon;
    forming a heat sink with a first face and a second face;
    integrally forming a plurality of cooling fins on the first face of the heat sink;
    integrally forming at least one pedestal on the second face of the heat sink, the at least one pedestal having a location on the second face and a height to cause the pedestal to be in thermal contact with at least one component of the circuit board when the heat sink is assembled in its operable position with the circuit board;

integrally forming a groove with continuous sidewalls in the second face; and disposing a gasket of electromagnetic interference (EMI) material in the groove to form a Faraday cage with the heat sink being assembled with the circuit board, wherein the gasket is substantially completely covered by the sidewalls of the groove when the heat sink is assembled with the circuit board.

14. The method of claim 13, wherein each of the cooling fins have a predetermined aspect ratio to maintain a junction temperature along a thermal contact area between the heat sink and the components at or below a predetermined maximum design value.

15. The method of claim 13, wherein the at least one pedestal has dimensions to provide a predetermined contact area between the heat sink and at least one of the components to prevent a junction temperature from exceeding a maximum design value.

16. A method comprising:

forming a heat sink with a first face and a second face;

integrally forming a plurality of cooling fins on the first face of the heat sink;

integrally forming at least one pedestal on the second face of the heat sink, the at least one pedestal having a height to cause the pedestal to be in thermal contact with at least one component of a circuit board when the heat sink is assembled in its operable position with the circuit board;

integrally forming a groove with continuous sidewalls in the second face; and disposing a gasket of electromagnetic interference (EMI) material in the groove to form a Faraday cage, wherein the gasket is substantially completely covered by the sidewalls of the groove when the heat sink is assembled with the circuit board.

17. The method of claim 16, wherein each of the cooling fins have a predetermined aspect ratio to maintain a junction temperature along a thermal contact area between the heat sink and the components at or below a predetermined maximum design value.

18. The method of claim 16, wherein the at least one pedestal has dimensions to provide a predetermined contact area between the heat sink and at least one of the components to prevent a junction temperature from exceeding a maximum design value.

19. A heat sink, comprising:

a first face;

a second face disposed substantially opposite to the first face;

a plurality of cooling fins formed on the first face;

at least one pedestal formed on the second face to thermally couple to at least one component with a different height dimension relative to other components on a circuit board, the at least one pedestal including a contacting surface with features formed therein to correspond to features in a surface of the at least one component to provide a maximum area of contact between the second face and the at least one component;

a groove with continuous sidewalls integrally formed in the second face; and a gasket of electromagnetic interference (EMI) material disposed in the groove to form a Faraday cage around selected components on the circuit board with the heat sink being placed in a functional position on the circuit board.

20. A method comprising:

forming a heat sink with a first face and a second face;

integrally forming a plurality of cooling fins on the first face of the heat sink;

integrally forming at least one pedestal on the second face of the heat sink, the at least one pedestal having a height to cause the pedestal to be in thermal contact with at least one component of a circuit board when the heat sink is assembled in its operable position with the circuit board;

forming features in a contact surface of the at least one pedestal to correspond with features in a contact surface of the at least one component of the circuit board;

integrally forming a groove with continuous sidewalls in the second face; and disposing a gasket of electromagnetic interference (EMI) material in the groove to form a Faraday cage, wherein the gasket is substantially completely covered by the sidewalls of the groove when the heat sink is assembled with the circuit board.

* * * * *